United States Patent [19]

Ghosal

[11] Patent Number: 5,670,418
[45] Date of Patent: Sep. 23, 1997

[54] METHOD OF JOINING AN ELECTRICAL CONTACT ELEMENT TO A SUBSTRATE

[75] Inventor: Balaram Ghosal, Fishkill, N.Y.

[73] Assignee: International Business Machines Corporation, Armonk, N.Y.

[21] Appl. No.: 767,918

[22] Filed: Dec. 17, 1996

[51] Int. Cl.$^6$ .................................................. H01L 21/44
[52] U.S. Cl. ........................... 437/183; 437/192; 437/209; 437/189
[58] Field of Search ...................... 437/183, 189, 437/192, 194, 203, 209; 29/837, 838, 839

[56] References Cited

U.S. PATENT DOCUMENTS

| | | | |
|---|---|---|---|
| 2,989,578 | 6/1961 | Wagner et al. | 174/34 |
| 4,424,527 | 1/1984 | Rao et al. | 357/71 |
| 4,600,600 | 7/1986 | Pammer et al. | 437/183 |
| 4,940,181 | 7/1990 | Juskey, Jr. et al. | 228/180.2 |
| 4,982,267 | 1/1991 | Mones et al. | 357/71 |
| 5,400,220 | 3/1995 | Swamy | 361/760 |
| 5,418,471 | 5/1995 | Kardos | 324/758 |
| 5,446,625 | 8/1995 | Urbish et al. | 361/761 |
| 5,468,995 | 11/1995 | Higgins, III | 257/697 |
| 5,482,736 | 1/1996 | Glenn et al. | 427/96 |
| 5,486,494 | 1/1996 | Hotchkiss et al. | 437/209 |
| 5,519,580 | 5/1996 | Natarajan et al. | 361/760 |
| 5,545,589 | 8/1996 | Tomura et al. | 437/192 |

FOREIGN PATENT DOCUMENTS 2-034798   2/1990   Japan.

*Primary Examiner*—Kevin Picardat
*Attorney, Agent, or Firm*—Jenkens & Gilchrist; Michael J. Balconi-Lamica

[57] ABSTRACT

An outer coating of an electrically conductive material having low wetability with respect to solder is deposited over a gold coating previously deposited on an electrical contact element. After soldering the contact element to a substrate, the portion of the outer coating not covered by solder is removed from the contact element. The method of joining a contact element to a substrate in accordance with the present invention effectively solves the problem of solder climb to the critical contact area of the element without the need to provide masking or apply plating resist coatings to selected areas of the element.

8 Claims, 2 Drawing Sheets

METHOD OF JOINING AN ELECTRICAL CONTACT ELEMENT TO A SUBSTRATE

BACKGROUND OF THE INVENTION

This invention relates generally to a method of joining an electrical contact element to an electrically conductive surface on a substrate, and more particularly, to such a method that provides a gold plated socketable contact member.

Typically, socketable electrical contact members, i.e., electrical contacts adapted to be received within a mating socket, such as balls or columns in ball grid array (BGA) packages, are gold plated to assure corrosion resistance and the maintenance of good electrical conductivity over an extended period of time. However, when gold plated balls or columns are joined to substrate pads with solder, solder tends to wet the whole surface of the balls or columns, and thus the gold plating contact surface is often lost.

A previous attempt to address this problem is disclosed in Japanese patent publication J02034798-A, published Apr. 2, 1990 and assigned to Fujitsu Ltd., describes a method of selectively plating connecting pins by masking a first portion of the pin that is not to be soldered with a plating mask, applying a plating resist layer to the end of the pin which is to be soldered, then applying a second layer having low wetability with solder on the part of the pin that is not coated with the plating resist layer. The plating resist layer is then removed from the solderable end of the pin prior to soldering the pin to a substrate or other component. Selective plating of small contact members by masking a portion of the contact is extremely difficult, especially with small columns and balls, as typically used in BGA connections. Also, the above-described process requires multiple steps, all of which require extremely close tolerances to form a contact element that has sufficient solderable surface area and adequate contact area that is not covered by solder. The multiple steps and small tolerances add significant cost to electrical contacts that are manufactured in the above-described manner.

The present invention is directed to overcoming the problems set forth above. It is desirable to have a method of forming a socketable electrical contact that is soldered to an electrically conductive surface on a substrate without the need for masking the contact and applying plating resist layers which must be removed prior to making the solder connection to the substrate. It is also desirable to have such a method which provides a gold plated, electrically conductive, mateable surface.

BRIEF SUMMARY OF THE INVENTION

In accordance with one aspect of the present invention, a method of joining an electrical contact element to an electrically conductive surface on a substrate, includes coating the electrical contact element with gold, and then applying an outer coating of an electrically conductive material over the gold coating that has a capillarity with respect to a preselected solder that is less than the capillarity of gold with respect to the preselected solder. The electrical contact element is then joined to the electrically conductive surface on the substrate by the preselected solder, whereby a first portion of the outer coating on the electrical contact element is covered by the preselected solder and a second portion of the outer coating is not covered by the solder. After joining, the second portion of the outer coating on the electrical contact element is removed, thereby exposing the gold coating underlying the second portion of the outer coating.

Other features of the method of joining an electrical contact element to an electrically conductive surface on a substrate, in accordance with the present invention, includes applying a transition coating of an electrically conductive material such as nickel to the electrical contact element prior to coating the electrical contact element with gold. Other features include the outer coating of electrically conductive material being selected from the group consisting of nickel, copper and aluminum. Still other features of the method embodying the present invention include the contact element being either a pin or ball adapted for seating in a mating socket provided on an electrical circuit component.

BRIEF DESCRIPTION OF THE SEVERAL VIEWS OF THE DRAWING

A more complete understanding of the structure and operation of the present invention may be had by reference to the following detailed description when taken in conjunction with the accompanying drawings, wherein.

DETAILED DESCRIPTION OF THE INVENTION

Figure 1:
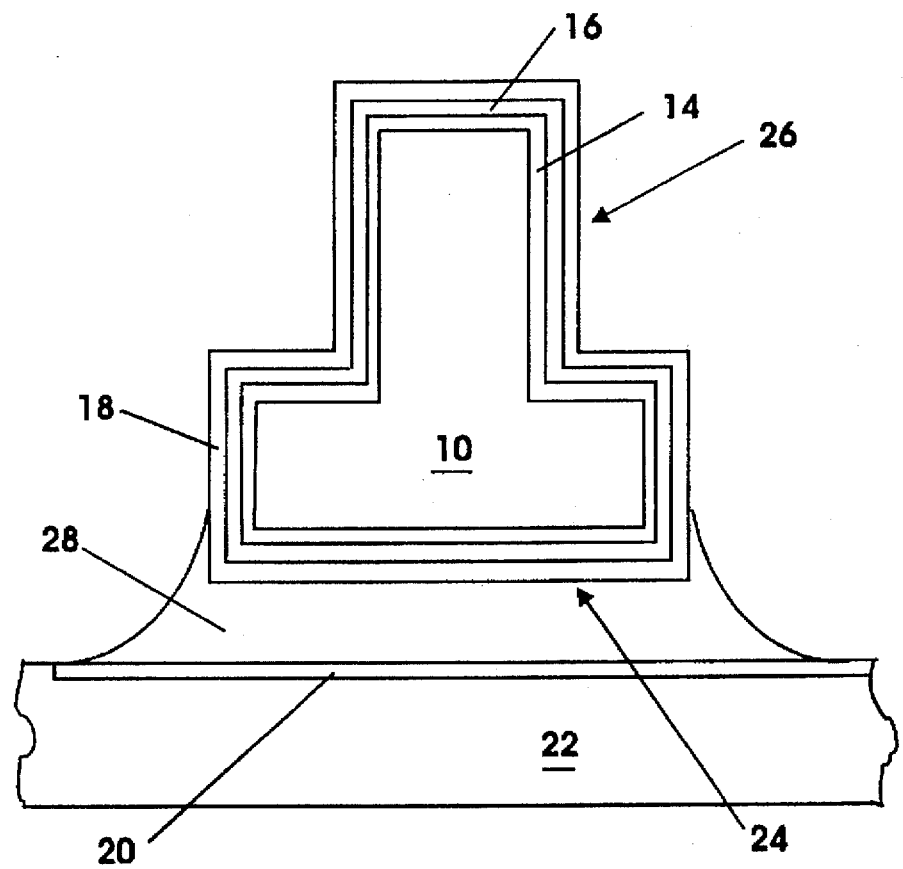
FIG. 1 is an enlarged schematic view of a pin or column electrical contact element embodying the present invention, after joining to a substrate.
Figure 2:
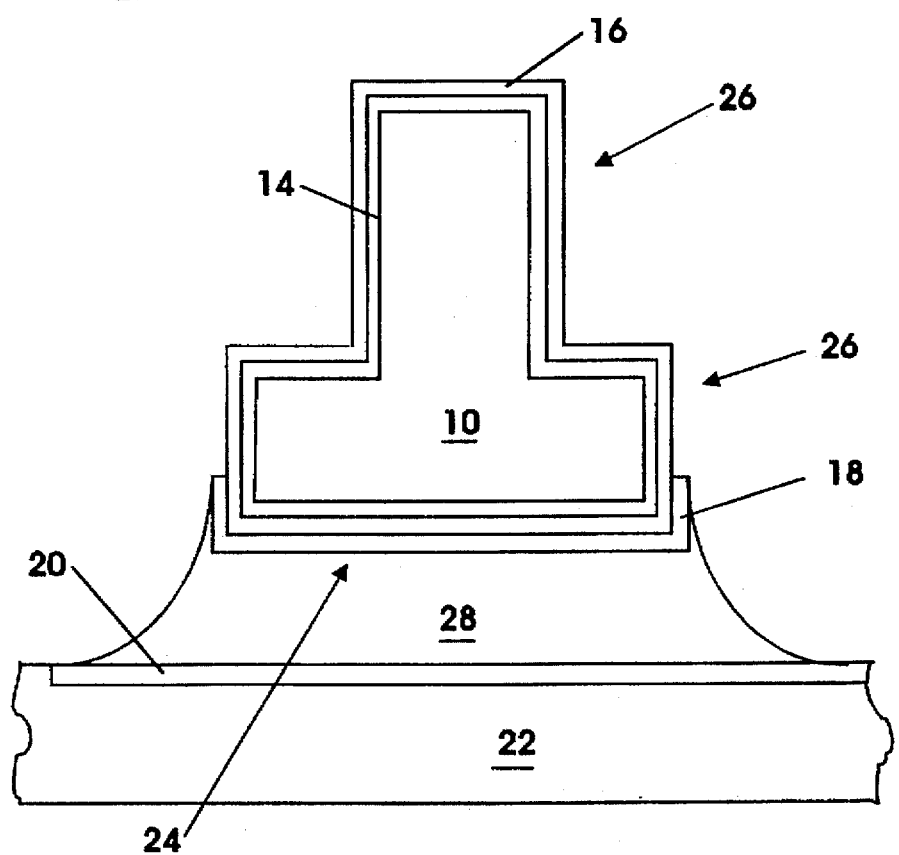
FIG. 2 is an enlarged schematic view of the pin or contact electrical contact element embodying the present invention, after removal of a portion of the outer coating on the element subsequent to joining to the substrate.
Figure 3:
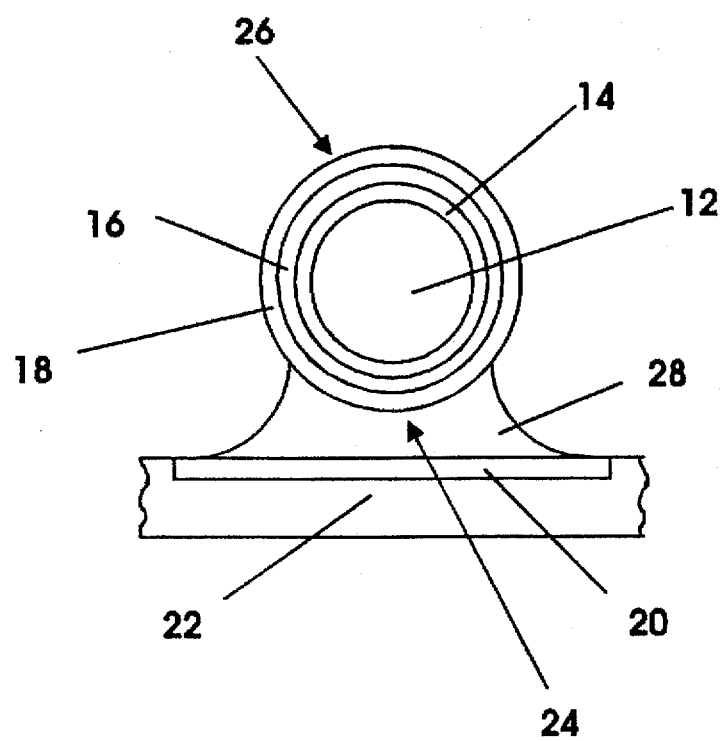
FIG. 3 is an enlarged schematic view of a ball contact electrical contact element embodying the present invention, after joining to a substrate.
Figure 4:
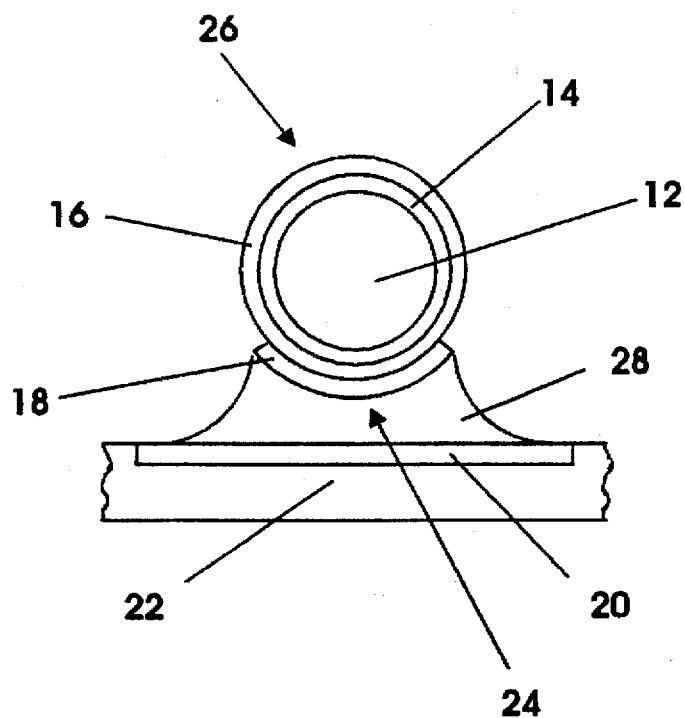
FIG. 4 is an enlarged schematic view of the ball contact electrical contact element embodying the present invention, after removal of a portion of the outer coating on the element subsequent to joining to the substrate.

The method of joining an electrical contact element to an electrically conductive surface on a substrate, in accordance with the present invention, is particularly suitable for forming small ball grid array (BGA) contacts on a substrate. As shown in the accompanying drawings, the electrically conductive contacts may either comprise a pin and column 10, as shown in FIGS. 1 and 2, or a ball 12, as shown in FIGS. 3 and 4. The pins 10 or balls 12 are typically formed of an electrically conductive material such as nickel, copper, or iron-nickel or iron-nickel-cobalt alloy. If formed of copper, or iron-nickel or iron-nickel-cobalt alloy, a transition coating 14 of an electrically conductive material such as nickel is generally deposited on the pin or ball 10, 12, to form a suitable metallurgical base for the subsequent deposition of a coating of gold 16. The transition coating 14 and the gold coating 16 are deposited by conventional methods such as deposition by electroplating or electroless plating.

After application of the gold coating 16 on the electrical contact element 10, 12, an outer coating 18 of an electrically conductive material is applied over the gold coating 16. In carrying out the method in accordance with the present invention, the electrically conductive outer coating is formed of a material having a capillarity with respect to a preselected solder that is less than the capillarity of gold with respect to the preselected solder. Suitable electrically conductive materials for the outer coating 18 include nickel, copper and aluminum. The outer coating is also applied by conventional coating deposition methods such as electroplating or electroless plating.

After application of the outer coating 18, the electrical contact element, 10, 12, having the outer coating 18 applied over the gold coating 16 is joined to an electrically conductive pad or surface 20 provided on a substrate 22 by soldering with a solder 28 having a preselected composition. Typically, the electrically conductive surface area 20 on the substrate 22 is an input/output (IO) pad on a printed circuit board.

The outer coating 18 restricts solder climb to a first portion 26 of the respective ball 12 or column 10, which defines the critical contact area of the element 10,12, while permitting the solder 28 to advantageously form a strong fillet between a second portion 24 of the respective contact element 10, 12 and the surface 20.

After soldering, the first portion 26 of the outer coating 18 is removed to expose the underlying gold coating 16. Preferably, the first portion 26 of the outer coating 18 is removed by etching the contact member 10, 12 with a solution capable of dissolving the first portion 26 of the outer coating 18 without adversely affecting the gold coating 16 or the solder 28. Suitable etchants for removing the outer coating 18 from the nonsoldered area 26 include a mixture of potassium iodide and nitric acid for nickel, ammonium persulfate for copper, and a 10% solutioin of sodium hydroxide for aluminum.

Thus, it can be seen that the method of joining an electrical contact element to an electrically conductive surface on a substrate, in accordance with the present invention, provides a gold plated contact element 10, 12. Furthermore, the method does not require the application of masks or plating resistance layers, or other additional steps to form an electrical contact that is suitable for insertion in a mating socket. The contacts 10, 12 formed in accordance with the present invention are particularly suitable for use in ball grid array structures.

Although the present invention is described in terms of a preferred exemplary embodiment, with specific illustrative key constructions and coatings, those skilled in the art will recognize that changes in those constructions and coatings, in the specifically identified materials, may be made without departing from the spirit of the invention. Such changes are intended to fall within the scope of the following claims. Other aspects, features, and advantages of the present invention may be obtained from a study of this disclosure and the drawings, along with the appended claims.

What is claimed is:

1. A method of joining an electrical contact element to an electrically conductive surface on a substrate, comprising:

coating said electrical contact element with gold;

applying an outer coating of an electrically conductive material over said gold coating, said electrical conductive material of said outer coating having capillarity with respect to a preselected solder less than the capillarity of gold with respect to said preselected solder;

joining said electrical contact element having said outer coating applied over said gold coating to said electrically conductive surface on a substrate by said preselected solder whereby a first portion of the outer coating on said electrical contact element is covered by said preselected solder and a second portion of the outer coating is not covered by said solder; and removing said second portion of the outer coating on the electrical contact element and thereby exposing the gold coating underlying said second portion of the outer coating.

2. A method of joining an electrical contact element to an electrically conductive surface on a substrate, as set forth in claim 1, wherein said method includes applying a transition coating of an electrically conductive material on said electrical contact element prior to coating the electrical contact element with gold.

3. A method of joining an electrical contact element to an electrically conductive surface on a substrate, as set forth in claim 2, wherein said transition coating is nickel.

4. A method of joining an electrical contact element to an electrically conductive surface on a substrate, as set forth in claim 1, wherein said applying an outer coating of an electrically conductive material over said gold coating includes applying a coating of a material selected from the group consisting of nickel, copper and aluminum.

5. A method of joining an electrical contact element to an electrically conductive surface on a substrate, as set forth in claim 1, wherein said removing said second portion of the outer coating of the electrical contact element includes etching said second portion of the outer coating with a solution capable of dissolving said second portion of the outer coating without adversely affecting said gold coating and said solder.

6. A method of joining an electrical contact element to an electrically conductive surface on a substrate, as set forth in claim 5, wherein said solution is selected from the group consisting of a mixture of potassium iodide and nitric acid, ammonium persulfate, and a 10% solution of ammonium hydroxide.

7. A method of joining an electrical contact element to an electrically conductive surface on a substrate, as set forth in claim 1, wherein said electrical contact element is a column adapted for seating in a mating socket provided on an electrical circuit component.

8. A method of joining an electrical contact element to an electrically conductive surface on a substrate, as set forth in claim 1, wherein said electrical contact element is a ball adapted for seating in a mating socket provided on an electrical circuit component.

* * * * *